(12) United States Patent
Li et al.

(10) Patent No.: US 9,337,206 B2
(45) Date of Patent: May 10, 2016

(54) SEMICONDUCTOR DEVICE, RELATED MANUFACTURING METHOD, AND RELATED ELECTRONIC DEVICE

(71) Applicant: Semiconductor Manufacturing International (Shanghai) Corporation, Shanghai (CN)

(72) Inventors: Guanhua Li, Shanghai (CN); Haewan Yang, Shanghai (CN)

(73) Assignee: SEMICONDUCTOR MANUFACTURING INTERNATIONAL (SHANGHAI) CORPORATION (CN)

(*) Notice: Subject to any disclaimer, the term of this patent is extended or adjusted under 35 U.S.C. 154(b) by 0 days.

(21) Appl. No.: 14/754,287

(22) Filed: Jun. 29, 2015

(65) Prior Publication Data

US 2016/0043094 A1 Feb. 11, 2016

(30) Foreign Application Priority Data

Aug. 8, 2014 (CN) .......................... 2014 1 0389664

(51) Int. Cl.

| | |
|---|---|
| *H01L 27/088* | (2006.01) |
| *H01L 21/336* | (2006.01) |
| *H01L 21/3205* | (2006.01) |
| *H01L 21/4763* | (2006.01) |
| *H01L 27/115* | (2006.01) |
| *H01L 21/28* | (2006.01) |
| *H01L 21/3213* | (2006.01) |
| *H01L 21/311* | (2006.01) |

(52) U.S. Cl.
CPC .... *H01L 27/11524* (2013.01); *H01L 21/28273* (2013.01); *H01L 21/31144* (2013.01); *H01L 21/32139* (2013.01); *H01L 27/11534* (2013.01)

(58) Field of Classification Search
CPC ................... H01L 27/11524; H01L 21/28273; H01L 21/31144; H01L 27/32139; H01L 27/11534
USPC .......... 257/401; 438/266, 283, 595, 639, 666, 438/702
See application file for complete search history.

(56) References Cited

U.S. PATENT DOCUMENTS

| | | | |
|---|---|---|---|
| 2005/0074949 A1* | 4/2005 | Jung et al. ..................... | 438/424 |
| 2006/0267075 A1* | 11/2006 | Sandhu et al. ................ | 257/316 |
| 2007/0049032 A1* | 3/2007 | Abatchev et al. ............. | 438/691 |
| 2010/0248153 A1* | 9/2010 | Lee et al. ...................... | 430/312 |
| 2011/0020992 A1* | 1/2011 | Purayath et al. .............. | 438/259 |

* cited by examiner

*Primary Examiner* — Long K Tran
*Assistant Examiner* — Dzung Tran
(74) *Attorney, Agent, or Firm* — Innovation Counsel LLP

(57) ABSTRACT

A method for manufacturing a semiconductor device may include the following steps: providing a composite structure that includes a gate material layer, a first mask material layer, and a sacrificial layer; partially removing, through a first mask, the sacrificial layer to form a sacrificial members; providing a second mask material layer on the sacrificial members; partially removing the second mask material layer to form mask units that contact sides of the sacrificial members; removing the sacrificial members; providing a third mask material layer between two of the mask units for forming a second mask; partially removing, through the second mask, the first mask material layer to form a third mask; and partially removing, through the third mask, the gate material layer to form a control gate and a select gate.

18 Claims, 10 Drawing Sheets

1001 Providing a composite structure that includes a floating gate material layer, a control gate material layer, a first mask material layer, and a sacrificial layer; providing a first mask on the composite structure, wherein the first mask includes mask members that include a first mask member and a second mask member

↓

1002 Partially removing, through the first mask, the sacrificial layer to form sacrificial members that include a first sacrificial member and a second sacrificial member, wherein the first sacrificial member corresponds to the first mask member, and wherein the second sacrificial member corresponds to the second mask member

↓

1003 Providing a second mask material layer on the sacrificial members

↓

1004 Partially removing the second mask material layer to form mask units that include a first mask unit, a second mask unit, and a third mask unit, wherein the first mask unit corresponds to (and contacts) a side of the first sacrificial member, wherein the second mask unit corresponds to (and contacts) a first side of the second sacrificial member, and wherein the third mask unit corresponds to (and contacts) a second side of the second sacrificial member; removing the sacrificial members

↓

1005 Providing a third mask material layer between the second mask unit and the third mask unit, such that the third mask material layer and the mask units, in combination, form a second mask

↓

1006 Partially removing, through the second mask, the first mask material layer to form a third mask, wherein the third mask includes mask elements that include a first mask element and a second mask element, wherein the first mask element corresponds to the first mask unit, and wherein the second mask element corresponds to a combination of the third mask material layer, the second mask unit, and the third mask unit

↓

1007 Partially removing, through the third mask, the control gate material layer and the floating gate material layer to form a control gate and a select gate, wherein the control gate corresponds to the first mask element, and wherein the select gate corresponds to the second mask element

FIG. 10

SEMICONDUCTOR DEVICE, RELATED MANUFACTURING METHOD, AND RELATED ELECTRONIC DEVICE

CROSS-REFERENCE TO RELATED APPLICATION

This application claims priority to and benefit of Chinese Patent Application No. 201410389664.1, filed on 8 Aug. 2014; the Chinese Patent Application is incorporated herein by reference in its entirety.

BACKGROUND OF THE INVENTION

The present invention is related to a semiconductor device, a method for manufacturing the semiconductor device, and an electronic device that includes the semiconductor device.

A semiconductor device, such as a flash memory device, may include a plurality of control gates and at least one select gate. The control gates may be positioned at a cell region of the semiconductor device. The select gate may be positioned at a peripheral region of the semiconductor device adjacent to the cell region of the semiconductor device.

The control gates may be smaller than the select gate. Therefore, the process performed for forming the control gates may be significantly different from and/or substantially independent of the process performed for forming the select gate. As a result, the distance between the select gate and the cell region (and/or distances between the select gate and the control gates) cause the semiconductor not to satisfy related design specifications, e.g., a specification related to a gate voltage, such that the quality of the semiconductor device and the related manufacturing yield may be unsatisfactory.

SUMMARY

An embodiment of the present invention may be related to a method for manufacturing a semiconductor device. The method may include providing a composite structure. The composite structure may include a substrate structure (e.g., a semiconductor substrate), a floating gate material layer overlapping the substrate structure, a control gate material layer overlapping the floating gate material layer, a first mask material layer overlapping the control gate material layer, and a sacrificial layer overlapping the first mask material layer. The composite structure may include an etch stop layer positioned between the first mask material layer and the sacrificial layer. The composite structure may include an oxide layer positioned between the control gate material layer and the first mask material layer.

The method may further include providing a first mask on the composite structure. The first mask may include a plurality of mask members that may include a first mask member and a second mask member.

The method may further include partially removing, through the first mask, the sacrificial layer to form a plurality of sacrificial members that may include a first sacrificial member and a second sacrificial member. The first sacrificial member may correspond to the first mask member. The second sacrificial member may correspond to the second mask member.

The method may further include providing a second mask material layer on the sacrificial members. The second mask material layer may cover tops and sides of the sacrificial members.

The method may further include partially removing the second mask material layer to form a plurality of mask units that may include a first mask unit, a second mask unit, and a third mask unit. The first mask unit may correspond to (and may directly contact) a side of the first sacrificial member. The second mask unit may correspond to (and may directly contact) a first side of the second sacrificial member. The third mask unit may correspond to (and may directly contact) a second side of the second sacrificial member. The width of the first mask unit, the width of the second mask unit, and the width of the third mask unit may be substantially equal to one another and may be substantially equal to a thickness of the second mask material layer. The thickness of the second mask material layer may be in a direction perpendicular to a contact surface of the second mask material layer that contacts a top or a side of one of the sacrificial members.

The method may further include removing the sacrificial members.

The method may further include providing a third mask material layer between the second mask unit and the third mask unit. The third mask material layer and the mask units, in combination, may form a second mask.

The method may further include partially removing, through the second mask, the first mask material layer to form a third mask. The third mask may include a plurality of mask elements that may include a first mask element and a second mask element. The first mask element may correspond to the first mask unit. A width of the first mask element may be substantially equal to a width of the first mask unit in a direction parallel to the bottom surface of the substrate. The second mask element may correspond to a combination of the third mask material layer, the second mask unit, and the third mask unit. A width of the second mask element may be substantially equal to a sum of a width of the third mask material layer, a width of the second mask unit, and a width of the third mask unit in the direction parallel to the bottom surface of the substrate.

The method may further include partially removing, through the third mask, the control gate material layer and the floating gate material layer to form a control gate of the semiconductor device and to form a select gate of the semiconductor device. The control gate may correspond to the first mask element. A width of the control gate may be substantially equal to a width of the first mask element in the direction parallel to the bottom surface of the substrate. The select gate may correspond to the second mask element. A width of the select gate may be substantially equal to a width of the second mask element in the direction parallel to the bottom surface of the substrate.

The method may include forming a floating gate of the semiconductor device when forming the select gate. The floating gate may overlap the control gate.

The method may include the following steps: determining at least one of a target thickness of the second mask material layer and a material of the second mask material layer based on at least a specified range of a roughness related to the select gate; and forming the second mask material layer using the target thickness of the second mask material layer and/or the determined material of the second mask material layer.

The method may include the following steps: determining a target value of a distance between the first mask member and the second mask member based on at least a specification related to the control gate and the select gate; and forming the first mask using the target value of the distance. The specification may include a specified range related to a distance between the control gate and the select gate. For example, the specified range may be a predetermined range of a gate voltage of the semiconductor device, a predetermined range of the distance between the control gate and the select gate, or a predetermined range of the distance between the cell region of the semiconductor device and the select gate.

The method may include the following steps: determining a target thickness of the second mask material layer based on at least a specification related to the control gate; and forming the second mask material layer using the target thickness of the second mask material layer. The specification may include a specified range related to a width of the control gate. For example, the specified range may be a predetermined range of a gate voltage of the semiconductor device or a predetermined range of the width of the control gate.

The method may include the following steps: determining a target width of the second mask member based on at least the target thickness of the second mask material layer and a specification related to the select gate; and forming the first mask using the target width of the second mask member. The specification may include a specified range related to a width of the select gate. For example, the specified range may be a predetermined range of a gate voltage of the semiconductor device or a predetermined range of the width of the select gate.

The method may include the following steps: determining a target width of the second sacrificial member based on at least the target thickness of the second mask material layer and a specification related to the select gate; and forming the first mask using the target width of the second sacrificial member. The specification may include a specified range related to a width of the select gate.

The method may include the following steps: determining a target value of a distance between the second mask unit and the third mask unit based on at least the target thickness of the second mask material layer and a specification related to the select gate; and forming the first mask using the target value of the distance. The specification may include a specified range related to a width of the select gate.

The method may include the following steps: determining a target value of a distance between the first mask unit and the second mask unit based on at least a specification related to both the control gate and the select gate; and forming the first mask using the target thickness of the second mask material layer and the target value of the distance. The specification may include a specified range related to a distance between the control gate and the select gate.

An embodiment of the present invention may be related to a semiconductor device. The semiconductor device may include the following elements: a plurality of control gates that may be positioned at a cell region of the semiconductor device and may include a first control gate; and a select gate that may be positioned at a peripheral region of the semiconductor device and may be spaced from the first control gate. A value of a distance between the select gate and the first control gate may be within a predetermined range and/or may satisfy one or more design specifications.

The first control gate may be at an edge of the plurality of control gates and/or may be positioned between two other control gates of the plurality of control gates.

An embodiment of the present invention may be related to an electronic device. The electronic device may include the following elements: an electronic component; and a semiconductor device electrically connected to the electronic component. The semiconductor device may include the following elements: a plurality of control gates that is positioned at a cell region of the semiconductor device and includes a first control gate; and a select gate that may be positioned at a peripheral region of the semiconductor device and may be spaced from the first control gate, wherein a value of a distance between the select gate and the first control gate may be within a predetermined range and/or may satisfy one or more design specifications.

Embodiments of the invention may enable effective and consistent implementation of distances between select gates and control gates in manufacturing processes of semiconductor devices. Distances between select gates and cell regions also may be effectively and consistently implemented in an analogous manner. Therefore, the distances may substantially satisfy design specifications and/or may be substantially consistent. Advantageously, satisfactory quality of the semiconductor devices and a satisfactory yield of the manufacturing process may be substantially attained.

The above summary is related to some of many embodiments of the invention disclosed herein and is not intended to limit the scope of the invention.

BRIEF DESCRIPTION OF THE DRAWINGS

FIG. 10 shows a flowchart that illustrates steps in a method for manufacturing a semiconductor device in accordance with one or more embodiments of the present invention.

DETAILED DESCRIPTION

Figure 1:
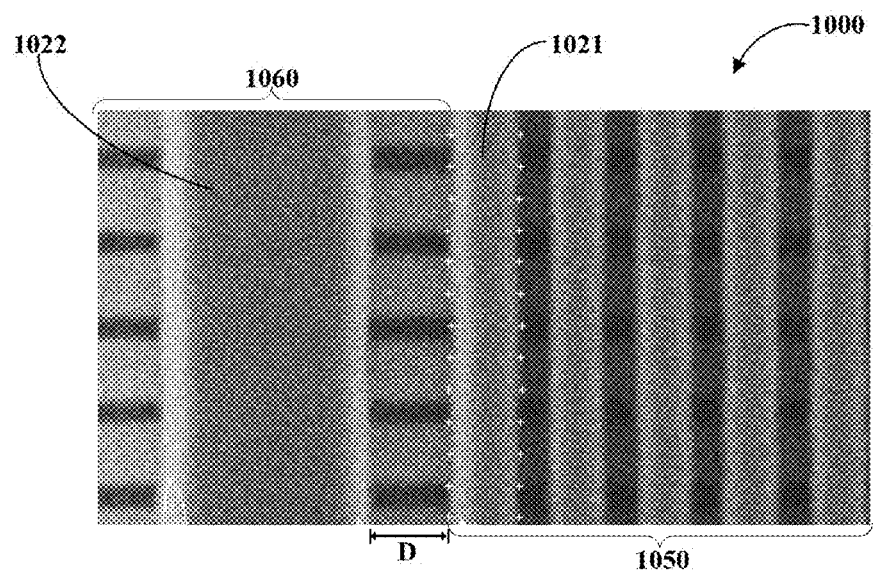
FIG. 1 shows a schematic diagram (e.g., a schematic layout view) that illustrates elements and/or structures in a semiconductor device in accordance with one or more embodiments of the present invention.

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive"

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

Figure 2:
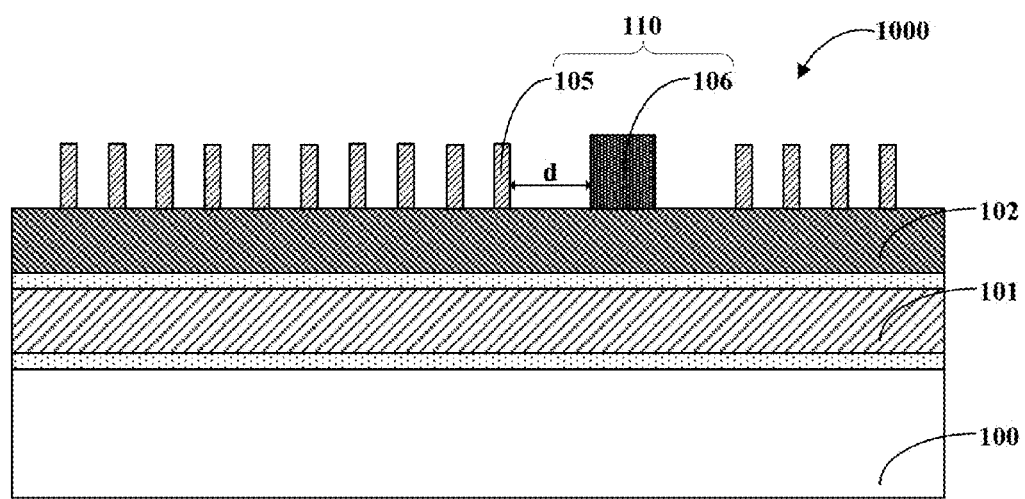
FIG. 2 shows a schematic diagram (e.g., a schematic cross-sectional view) that illustrates elements and/or structures formed in a method for manufacturing a semiconductor device in accordance with one or more embodiments of the present invention.

FIG. 1 shows a schematic diagram (e.g., a schematic layout view) that illustrates elements and/or structures in a semiconductor device 1000 in accordance with one or more embodiments of the present invention. FIG. 2 shows a schematic diagram (e.g., a schematic cross-sectional view) that illustrates elements and/or structures formed in a method for manufacturing the semiconductor device 1000 in accordance with one or more embodiments of the present invention.

Referring to FIG. 1, the semiconductor device 1000 may include a plurality of control gates that is positioned in a cell region 1050 of the semiconductor device 1000 and includes a control gate 1021. The semiconductor device 1000 may further include a select gate 1022 that is positioned in a peripheral region 1060 of the semiconductor device 1000 and is spaced from the first control gate. A value of a distance D between the select gate 1022 and the control gate 1021 may be within a predetermined range, such that the semiconductor device 1000 may satisfy design specifications.

The control gate 1021 may be at an edge of the plurality of control gates. Distances between the select gate 1022 and other control gates, e.g., control gates positioned between two or more other control gates, also may satisfy design specifications.

Referring to FIG. 2, the method for manufacturing the semiconductor device 1000 may include the following steps: providing a composite structure that includes a substrate 100, a floating gate material layer 101 positioned on the substrate 100, and a control gate material layer 102 positioned on the floating gate material member 101; determining a target value of a distance d between a mask element 105 and a mask element 106 based on at least a predetermined range or predetermined value of the distance D; providing a mask 110 that includes at least the mask element 105 and the mask element 106 on the composite structure according to (and/or using) at least the target value of the distance d; and etching, through the mask 110, the control gate material layer 102 and the floating gate material layer 101 to substantially simultaneously form the control gate 1021 and the select gate 1022. A material of the mask element 105 may be the same as or different from a material of the mask element 106. The resulted value of the distance D may be substantially equal to the implemented value of the distance d. Advantageously, the distance D may be effectively and consistently implemented, and characteristics of the semiconductor device 1000 (e.g., a gate voltage of the semiconductor device 1000) related to the distance D1 may substantially satisfy corresponding design specifications and/or performance requirements.

FIG. 3, FIG. 4, FIG. 5, FIG. 6, FIG. 7, and FIG. 8, show schematic diagrams (e.g., schematic cross-sectional views taken/cut along a bit line direction) that illustrate elements and/or structures formed in a method for manufacturing a semiconductor device 900 in accordance with one or more embodiments of the present invention. FIG. 9 shows a schematic diagram (e.g., a schematic cross-sectional view) that illustrates elements and/or structures in the semiconductor device 900 in accordance with one or more embodiments of the present invention. FIG. 10 shows a flowchart that illustrates steps in a method for manufacturing the semiconductor device 900 in accordance with one or more embodiments of the present invention. In an embodiment, the semiconductor device 900 may be a memory device, such as a NAND flash memory device.

Referring to FIG. 10, the method may include steps 1001, 1002, 1003, 1004, 1005, 1006, and 1007.

Figure 3:
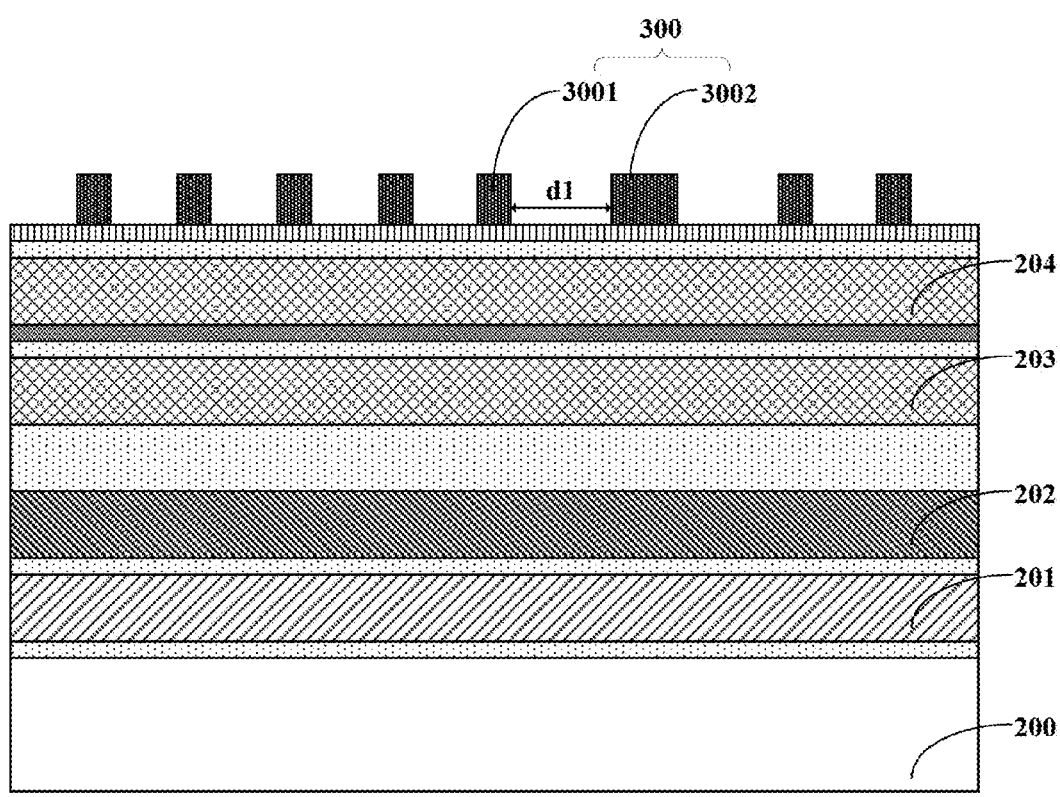
FIG. 3, FIG. 4, FIG. 5, FIG. 6, FIG. 7, and FIG. 8 show schematic diagrams (e.g., schematic cross-sectional views) that illustrate elements and/or structures formed in a method for manufacturing a semiconductor device in accordance with one or more embodiments of the present invention.

Referring to FIG. 10 and FIG. 3, the step 1001 may include providing a composite structure. The composite structure may include a substrate structure 200, a floating gate material layer 201 overlapping the substrate structure 200, a control gate material layer 202 overlapping the floating gate material layer 201, a mask material layer 203 overlapping the control gate material layer 202, and a sacrificial layer 204 overlapping the mask material layer 203. The composite structure may further include an etch stop layer positioned between the mask material layer 203 and the sacrificial layer 204. The composite structure may further include an oxide layer positioned between the control gate material layer 202 and the mask material layer 203.

The substrate structure 200 may include a semiconductor substrate member. The semiconductor substrate member may be/include one or more of a monocrystalline silicon substrate, a silicon-on-insulator (SOI) substrate, etc. The substrate structure 200 may include one or more elements (e.g., conductive elements, semiconducting elements, and/or dielectric elements) positioned in or on the semiconductor substrate member. The floating gate material layer 201 and/or the control gate material layer 202 may be formed of one or more of polycrystalline silicon, etc. The mask material layer 203 and/or the sacrificial layer 204 may be formed of one or more of amorphous carbon, etc.

The step 1001 may further include providing a mask 300 on the composite structure. The mask 300 may include a plurality of mask members that may include a mask member 3001 and a mask member 3002. The mask 300 may be formed of one or more of a photoresist material, etc.

Figure 4:
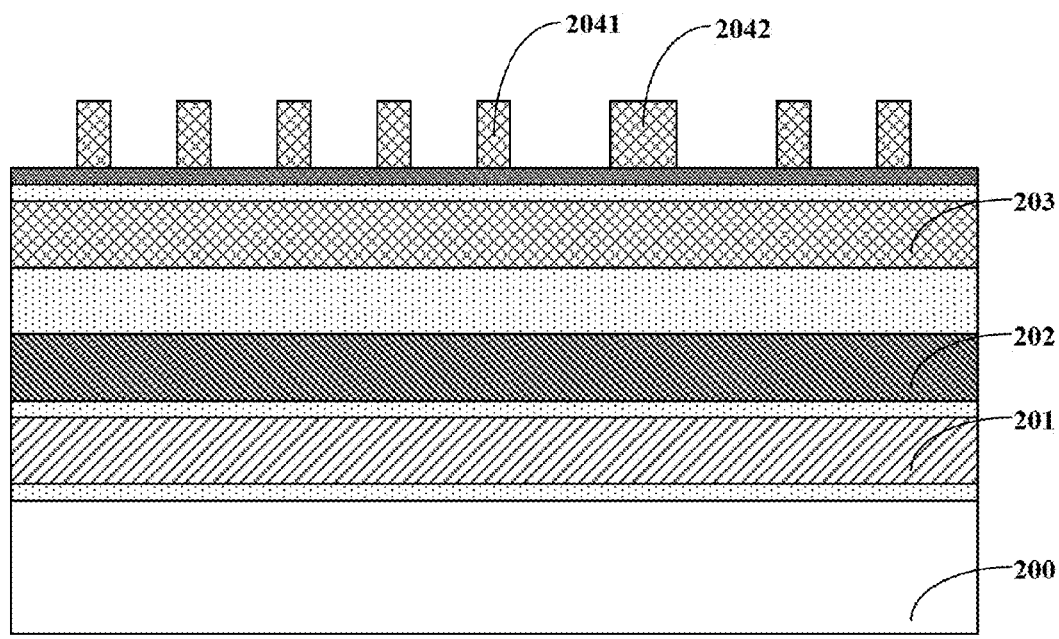

Referring to FIG. 10, FIG. 3, and FIG. 4, subsequent to the step 1001, the step 1002 may include partially removing, through the mask 300, the sacrificial layer 204 to form a plurality of sacrificial members that may include a sacrificial member 2041 and a sacrificial member 2042. The sacrificial member 2041 may correspond to the mask member 3001. The sacrificial member 2042 may correspond to the mask member 3002. The partial removal process may be/include one or more of an etching process, etc.

Figure 5:
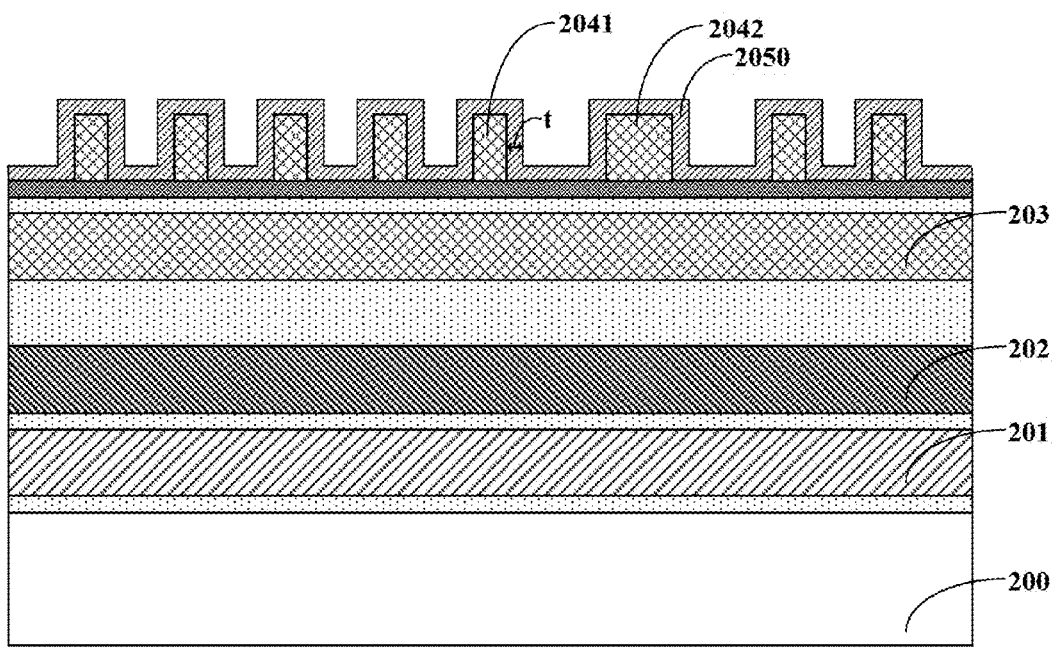

Referring to FIG. 10, FIG. 4, and FIG. 5, subsequent to the step 1002, the step 1003 may include providing a mask material layer 2050 on the sacrificial members (including the sacrificial members 2041 and 2042). The mask material member 2050 may cover tops and sides of the sacrificial members. The mask material member 2050 may be formed of one or more of silicon oxide, silicon nitride, etc.

Figure 6:
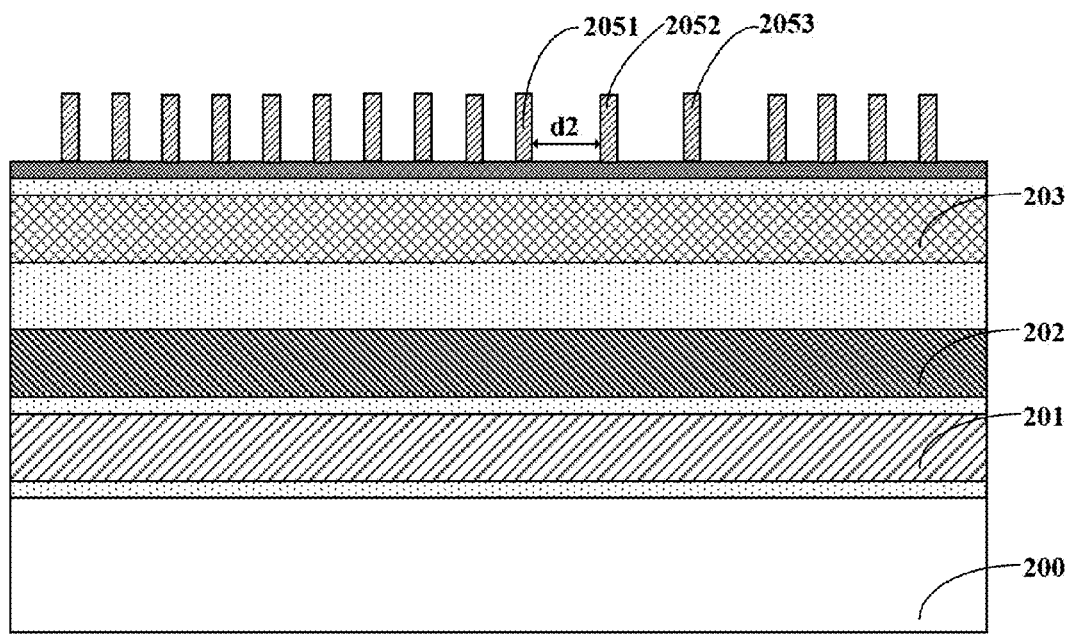

Referring to FIG. 10, FIG. 5, and FIG. 6, subsequent to the step 1003, the step 1004 may include partially removing the mask material layer 2050 to form a plurality of mask units that may include a mask unit 2051, a mask unit 2052, and a mask unit 2053. The partial removal process may be/include one or more of an etching process, etc. The mask unit 2051 may correspond to (and may directly contact) a side of the sacrificial member 2041. The mask unit 2052 may correspond to (and may directly contact) a first side of the sacrificial member 2042. The mask unit 2053 may correspond to (and may directly contact) a second side of the sacrificial member 2042. The width of the mask unit 2051, the width of the mask unit 2052, and the width of the mask unit 2053 may be substantially equal to one another and may be substantially equal to a thickness of the mask material layer 2050. The thickness of the mask material layer 2050 may be in a direction perpendicular to a contact surface of the mask material layer 2050 that contacts a top or a side of one of the sacrificial members (e.g., a side of the sacrificial member 2041 or a side of the sacrificial member 2042). The step 1004 may further include removing the sacrificial members.

Figure 7:
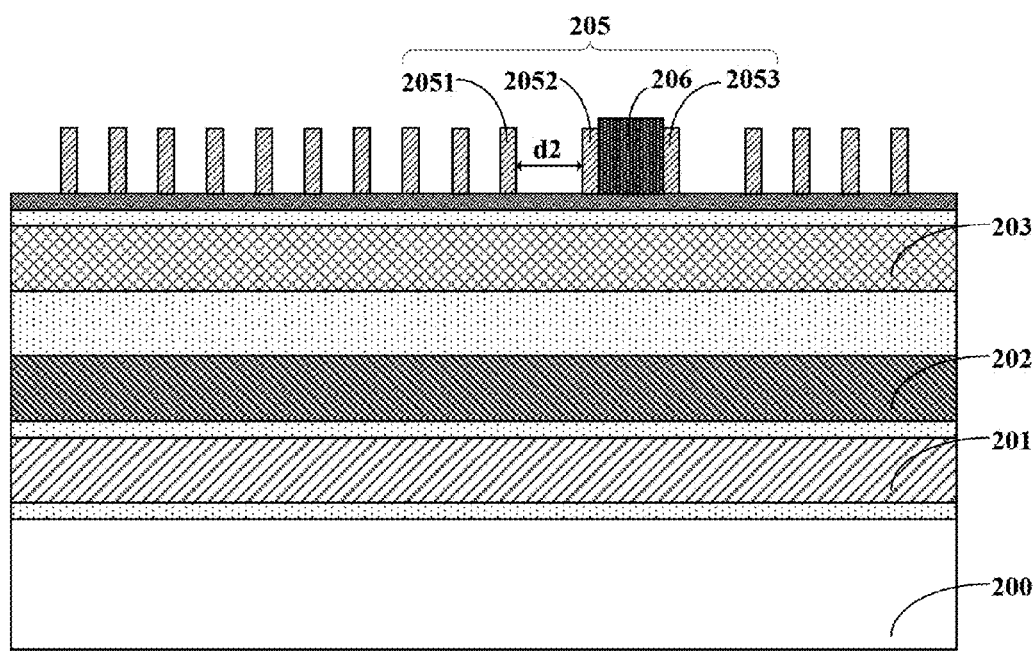

Referring to FIG. 10, FIG. 6, and FIG. 7, subsequent to the step 1004, the step 1005 may include providing a mask material layer 206 between the mask unit 2052 and the mask unit 2053, such that the mask material layer 206 and the mask units (e.g., 2051, 2052, and 2053), in combination, may form a mask 205. The mask material layer 206 may be formed of one or more of a photoresist material, etc.

Figure 8:
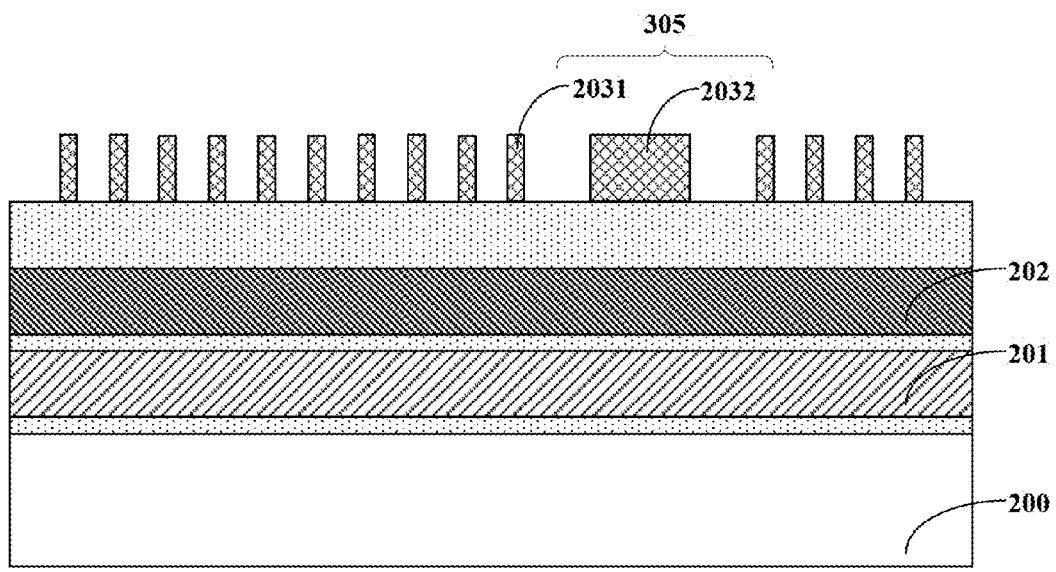
Figure 9:
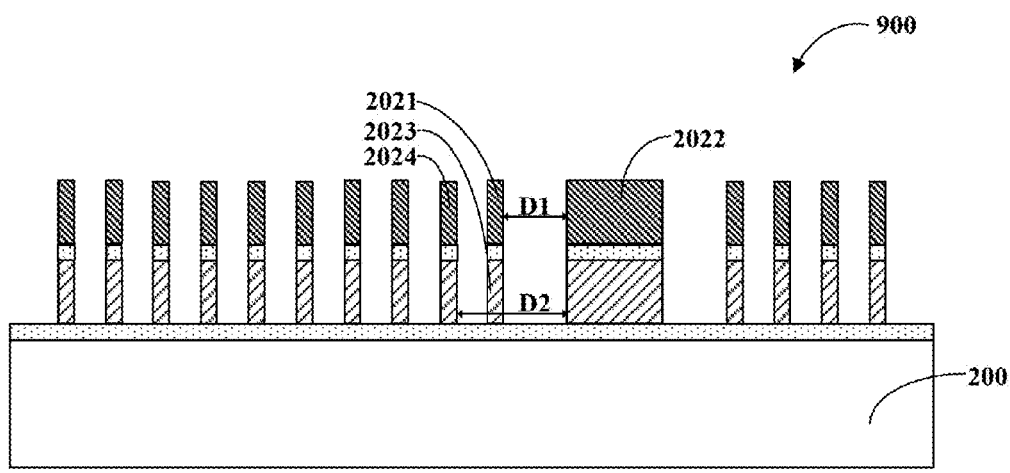
FIG. 9 shows a schematic diagram (e.g., a schematic cross-sectional view) that illustrates elements and/or structures in a semiconductor device in accordance with one or more embodiments of the present invention.

Referring to FIG. 10, FIG. 7, and FIG. 8, subsequent to the step 1005, the step 1006 may include partially removing, through the mask 205, the mask material layer 203 to form a mask 305. The mask 305 may include a plurality of mask elements that may include a mask element 2031 and a mask element 2032. The partial removal process may be/include one or more of an etching process, etc. The mask element 2031 may correspond to the mask unit 2051. A width of the mask element 2031 may be substantially equal to a width of the mask unit 2051 in a direction parallel to the bottom surface of the substrate structure 200. The mask element 2032 may correspond to a combination of the mask material layer 206, the mask unit 2052, and the mask unit 2053. A width of the mask element 2032 may be substantially equal to a sum of a width of the mask material layer 206, a width of the mask unit 2052, and a width of the mask unit 2053 in the direction parallel to the bottom surface of the substrate structure 200.

Referring to FIG. 10, FIG. 8, and FIG. 9, subsequent to the step 1006, the step 1007 may include partially removing, through the mask 305, the control gate material layer 202 and the floating gate material layer 201 to form a control gate 2021, a control gate 2024, a select gate 2022, and other gates of the semiconductor device 900. The partial removal process may be/include one or more of a dry etching process, a wet etching process, etc. The control gate 2021 may be positioned at/near an edge of the cell region of the semiconductor device 900. The control gate 2024 may not be position at an edge of the cell region of the semiconductor device 900 and may be positioned between two other control gates. The control gate 2021 may correspond to the mask element 2031. A width of the control gate 2021 may be substantially equal to a width of the mask element 2031 in the direction parallel to the bottom surface of the substrate structure 200 and may be substantially equal to a thickness t of the mask material layer 2050. A width of the control gate 2024 may be substantially equal to a width of the control gate 2021. The select gate 2022 may correspond to the mask element 2032. A width of the select gate 2022 may be substantially equal to a width of the mask element 2032 in the direction parallel to the bottom surface of the substrate structure 200. A width of the select gate 2022 may be substantially equal to a sum of a width of the mask material layer 206 (or a distance between the mask units 2052 and 2053), a width of the mask unit 2052, and a width of the mask unit 2053, wherein the width of each of the mask units 2052 and 2053 may be substantially equal to a thickness t of the mask material layer 2050.

The step 1007 may include forming a floating gate 2023 of the semiconductor device 900 when forming the select gate 2022. The floating gate 2023 may overlap the control gate 2021.

The method may include the following steps: determining at least one of a target thickness t of the mask material layer 2050 and a material of the mask material layer 2050 based on at least a specified range of a roughness related to the select gate 2022; and forming the mask material layer 2050 using the target thickness t of the mask material layer 2050 and/or the determined material of the mask material layer 2050. Advantageously, the roughness related to the select gate 2022 may be optimized and/or may satisfy design specifications.

The method may include the following steps: determining a target value of a distance d1 between the mask member 3001 and the mask member 3002 based on at least a specification related to the control gate 2021 and the select gate 2022; and forming the mask 300 using (and/or according to at least) the target value of the distance d1. The specification may include a specified range related to a distance D1 between the control gate 2021 and the select gate 2022, a distance D2 between the control gate 2024 and the select gate 2022, and/or a gate voltage of the semiconductor device. For example, the specified range may be a predetermined range of a gate voltage of the semiconductor device 900, a predetermined range of the distance D1, a predetermined range of the distance D2, or a predetermined range of the distance between the cell region of the semiconductor device 900 and the select gate 2022. The distance D1 may be equal to and/or related to the distance between the cell region of the semiconductor device 900 and the select gate 2022.

The method may include the following steps: determining a target thickness t of the mask material layer 2050 based on at least a specification related to the control gate 2021; and forming the mask material layer 2050 using the target thickness t of the mask material layer 2050. The specification may include a specified range related to a width of the control gate 2021. For example, the specified range may be a predetermined range of a gate voltage of the semiconductor device 900 or a predetermined range of the width of the control gate 2021.

The method may include the following steps: determining a target width of the mask member 3002 based on at least the target thickness t of the mask material layer 2050 and a specification related to the select gate 2022; and forming the mask 300 using the target width of the mask member 3002. The specification may include a specified range related to a width of the select gate 2022. For example, the specified range may be a predetermined range of a gate voltage of the semiconductor 900 device or a predetermined range of the width of the select gate 2022.

The method may include the following steps: determining a target width of the sacrificial member 2042 based on at least the target thickness t of the mask material layer 2050 and a specification related to the select gate 2022; and forming the mask 300 using the target width of the sacrificial member 2042. The specification may include a specified range related to a width of the select gate 2022.

The method may include the following steps: determining a target value of a distance between the mask unit 2052 and the mask unit 2053 based on at least the target thickness t of the mask material layer 2050 and a specification related to the select gate 2022; and forming the mask 300 using the target value of the distance. The specification may include a specified range related to a width of the select gate 2022.

The method may include the following steps: determining a target value of a distance d2 between the mask unit 2051 and the mask unit 2052 based on at least a specification related to both the control gate 2021 and the select gate 2022; and forming the mask 300 using the target thickness t of the mask material layer 2050 and the target value of the distance. The specification may include a specified range related to a distance D1 between the control gate 2021 and the select gate 2022. For example, the specified range may be a predetermined range of a gate voltage of the semiconductor device 900, a predetermined range of the distance D1, a predetermined range of the distance D2, or a predetermined range of the distance between the cell region of the semiconductor device 900 and the select gate 2022. The resulted value of the distance D1 may be substantially equal to the implemented value of the distance d2.

As can be appreciated from the foregoing discussion, embodiments of the invention may enable effective and consistent implementation of distances between select gates and control gates (e.g., the distance D1 between the control gate 2021 and the select gate 2022) in manufacturing processes of semiconductor devices. Therefore, the distances may substantially satisfy design specifications and/or may be substantially consistent. Advantageously, satisfactory quality of the semiconductor devices and a satisfactory yield of the manufacturing process may be substantially attained.

Figure 11:
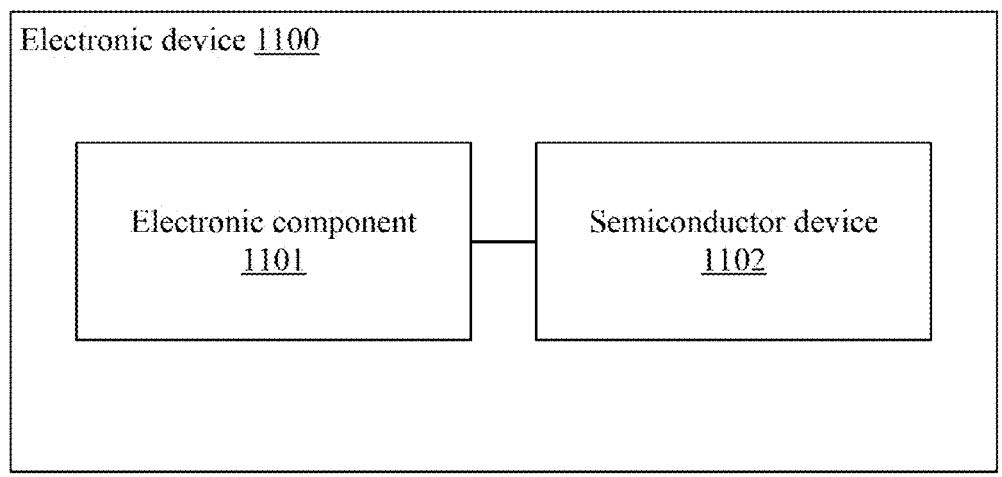
FIG. 11 shows a schematic block diagram that illustrates elements in an electronic device in accordance with one or more embodiments of the present invention.

FIG. 11 shows a schematic block diagram that illustrates elements in an electronic device 1100 in accordance with one or more embodiments of the present invention. The electronic device 1100 may include an electronic component 1101 and a semiconductor device 1102 that is electrically connected to the electronic component 1101. The semiconductor device 1102 may have one or more of the above-discussed features and advantages.

In an embodiment, the electronic device may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, a portable game device, etc.

In an embodiment, the electronic device may be or may include an intermediate product (e.g., a mobile phone main board) or module including a semiconductor device that may have one or more of the features and advantages discussed above.

Embodiments of the invention may enable effective and consistent implementation of distances between select gates and control gates in manufacturing processes of semiconductor devices. Distances between select gates and cell regions also may be effectively and consistently implemented in an analogous manner. Therefore, the distances may substantially satisfy design specifications and/or may be substantially consistent. Advantageously, satisfactory quality of the semiconductor devices and a satisfactory yield of the manufacturing process may be substantially attained.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for manufacturing a semiconductor device, the method comprising:
   providing a composite structure that includes a floating gate material layer, a control gate material layer overlapping the floating gate material layer, a first mask material layer overlapping the control gate material layer, and a sacrificial layer overlapping the first mask material layer;
   providing a first mask on the composite structure, wherein the first mask includes a first mask member and a second mask member;
   partially removing, through the first mask, the sacrificial layer to form a first sacrificial member and a second sacrificial member, wherein the first sacrificial member corresponds to the first mask member, and wherein the second sacrificial member corresponds to the second mask member;
   providing a second mask material layer on the first sacrificial member and the second sacrificial member;
   partially removing the second mask material layer to form a first mask unit, a second mask unit, and a third mask unit, wherein the first mask unit corresponds to a side of the first sacrificial member, wherein the second mask unit corresponds to a first side of the second sacrificial member, and wherein the third mask unit corresponds to a second side of the second sacrificial member;
   removing the first sacrificial member and the second sacrificial member;
   providing a third mask material layer between the second mask unit and the third mask unit to form a second mask that includes the third mask material layer, the first mask unit, the second mask unit, and the third mask unit;
   partially removing, through the second mask, the first mask material layer to form a third mask, wherein the third mask includes a first mask element and a second mask element, wherein the first mask element corresponds to the first mask unit, and wherein the second mask element corresponds to a combination of the third mask material layer, the second mask unit, and the third mask unit; and
   partially removing, through the third mask, the control gate material layer and the floating gate material layer to form a control gate of the semiconductor device and a select gate of the semiconductor device, wherein the control gate corresponds to the first mask element, and wherein the select gate corresponds to the second mask element.

2. The method of claim 1, wherein a width of the first mask unit is equal to a width of the second mask unit.

3. The method of claim 1, comprising: forming a floating gate of the semiconductor device when forming the select gate, wherein the floating gate overlaps the control gate.

4. The method of claim 1, wherein the composite structure includes an etch stop layer positioned between the first mask material layer and the sacrificial layer.

5. The method of claim 1, wherein the composite structure includes an oxide layer positioned between the control gate material layer and the first mask material layer.

6. The method of claim 1, comprising: determining at least one of a target thickness of the second mask material layer and a material of the second mask material layer based on at least a specified range of a roughness related to the select gate; and forming the second mask material layer using the at least one of the target thickness of the second mask material layer and the material of the second mask material layer.

7. The method of claim 1, comprising: determining a target value of a distance between the first mask member and the second mask member based on at least a specification related to the control gate and the select gate; and forming the first mask using the target value of the distance.

8. The method of claim 7, wherein the specification includes a specified range related to a distance between the control gate and the select gate.

9. The method of claim 1, comprising: determining a target thickness of the second mask material layer based on at least a specification related to the control gate; and forming the second mask material layer using the target thickness of the second mask material layer.

10. The method of claim 9, wherein the specification includes a specified range related to a width of the control gate.

11. The method of claim 9, comprising: determining a target width of the second mask member based on at least the target thickness of the second mask material layer and a specification related to the select gate; and forming the first mask using the target width of the second mask member.

12. The method of claim 11, wherein the specification includes a specified range related to a width of the select gate.

13. The method of claim 9, comprising: determining a target width of the second sacrificial member based on at least the target thickness of the second mask material layer and a specification related to the select gate; and forming the first mask using the target width of the second sacrificial member.

14. The method of claim 13, wherein the specification includes a specified range related to a width of the select gate.

15. The method of claim 9, comprising: determining a target value of a distance between the second mask unit and the third mask unit based on at least the target thickness of the second mask material layer and a specification related to the select gate; and forming the first mask using the target value of the distance.

16. The method of claim 15, wherein the specification includes a specified range related to a width of the select gate.

17. The method of claim 9, comprising: determining a target value of a distance between the first mask unit and the second mask unit based on at least a specification related to both the control gate and the select gate; and forming the first mask using the target thickness of the second mask material layer and the target value of the distance.

18. The method of claim 17, wherein the specification includes a specified range related to a distance between the control gate and the select gate.

* * * * *